(12) United States Patent
Tel et al.

(10) Patent No.: US 12,210,293 B2
(45) Date of Patent: Jan. 28, 2025

(54) METHOD FOR DETERMINING A MEASUREMENT RECIPE AND ASSOCIATED APPARATUSES

(71) Applicant: ASML NETHERLANDS B.V., Veldhoven (NL)

(72) Inventors: Wim Tjibbo Tel, Helmond (NL); Adriaan Johan Van Leest, Eindhoven (NL)

(73) Assignee: ASML NETHERLANDS B.V., Veldhoven (NL)

( * ) Notice: Subject to any disclaimer, the term of this patent is extended or adjusted under 35 U.S.C. 154(b) by 69 days.

(21) Appl. No.: 17/783,443

(22) PCT Filed: Dec. 17, 2020

(86) PCT No.: PCT/EP2020/086618
§ 371 (c)(1),
(2) Date: Jun. 8, 2022

(87) PCT Pub. No.: WO2021/122879
PCT Pub. Date: Jun. 24, 2021

(65) Prior Publication Data
US 2023/0035073 A1 Feb. 2, 2023

(30) Foreign Application Priority Data
Dec. 20, 2019 (EP) .................................... 19218690

(51) Int. Cl.
*G03F 7/20* (2006.01)
*G03F 7/00* (2006.01)

(52) U.S. Cl.
CPC ............................... *G03F 7/70633* (2013.01)

(58) Field of Classification Search
CPC .................. G03F 7/70633; G03F 7/70616
See application file for complete search history.

(56) References Cited

U.S. PATENT DOCUMENTS 6,952,253 B2   10/2005   Lof et al.
10,474,045 B2  11/2019   Bijnen et al.
(Continued)

FOREIGN PATENT DOCUMENTS

EP         1628164         2/2006
KR       20180027578        3/2018
(Continued)

OTHER PUBLICATIONS

International Search Report and Written Opinion issued in corresponding PCT Patent Application No. PCT/EP2020/086618, dated Mar. 26, 2021.
(Continued)

*Primary Examiner* — Mesfin T Asfaw
(74) *Attorney, Agent, or Firm* — Pillsbury Winthrop Shaw Pittman, LLP

(57) ABSTRACT

A method for determining a measurement recipe describing one or more measurement settings for measuring a parameter of interest from a substrate subject to an etch induced parameter error, the etch induced parameter error affecting measurement of the parameter of interest in a recipe dependent manner. The method include obtaining parameter of interest set-up data relating to measurements of at least one set-up substrate on which the parameter of interest has various first induced set values and etch induced parameter set-up data relating to measurements of at least one set-up substrate on which the etch induced parameter has various second induced set values. The recipe is determined so as to minimize the effect of the etch induced parameter on measurement of the parameter of interest.

20 Claims, 5 Drawing Sheets

(56) References Cited

U.S. PATENT DOCUMENTS

| | | | |
|---|---|---|---|
| 2004/0207824 A1 | 10/2004 | Lof et al. | |
| 2007/0296960 A1 | 12/2007 | Den Boef et al. | |
| 2008/0198380 A1 | 8/2008 | Straaijer et al. | |
| 2009/0168062 A1 | 7/2009 | Straaijer | |
| 2009/0242513 A1 | 10/2009 | Funk et al. | |
| 2010/0007863 A1 | 1/2010 | Jordanoska | |
| 2010/0328655 A1 | 12/2010 | Den Boef | |
| 2011/0026032 A1 | 2/2011 | Den Boef et al. | |
| 2011/0032500 A1 | 2/2011 | Straaijer | |
| 2011/0102753 A1 | 5/2011 | Van De Kerkhof et al. | |
| 2011/0102793 A1 | 5/2011 | Straaijer | |
| 2011/0188020 A1 | 8/2011 | Den Boef | |
| 2011/0249244 A1 | 10/2011 | Leewis et al. | |
| 2012/0044470 A1 | 2/2012 | Smilde et al. | |
| 2012/0044495 A1 | 2/2012 | Straaijer | |
| 2013/0162996 A1 | 6/2013 | Straaijer | |
| 2013/0308142 A1 | 11/2013 | Straaijer | |
| 2016/0370717 A1* | 12/2016 | Den Boef | G03F 7/70633 |
| 2018/0088470 A1 | 3/2018 | Bhattacharyya et al. | |

FOREIGN PATENT DOCUMENTS

| | | |
|---|---|---|
| WO | 2017009036 | 1/2017 |
| WO | 2018095705 | 5/2018 |

OTHER PUBLICATIONS

Taiwanese Office Action issued in corresponding Taiwanese Patent Application No. 109145010, dated Dec. 7, 2021.
Office Action issued in corresponding Korean Patent Application No. 10-2022-7020852, dated Oct. 18, 2024.

* cited by examiner

METHOD FOR DETERMINING A MEASUREMENT RECIPE AND ASSOCIATED APPARATUSES

CROSS-REFERENCE TO RELATED APPLICATIONS

This application is the U.S. national phase entry of PCT/EP2020/086618, which was filed on Dec. 17, 2020, which claims the benefit of priority of European Patent Application No. 19218690.6 which was filed on Dec. 20, 2019 and which is incorporated herein in its entirety by reference.

FIELD

The present invention relates to metrology applications in the manufacture of integrated circuits.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern (also often referred to as "design layout" or "design") at a patterning device (e.g., a mask) onto a layer of radiation-sensitive material (resist) provided on a substrate (e.g., a wafer).

To project a pattern on a substrate a lithographic apparatus may use electromagnetic radiation. The wavelength of this radiation determines the minimum size of features which can be formed on the substrate. Typical wavelengths currently in use are 365 nm (i-line), 248 nm, 193 nm and 13.5 nm. A lithographic apparatus, which uses extreme ultraviolet (EUV) radiation, having a wavelength within the range 4-20 nm, for example 6.7 nm or 13.5 nm, may be used to form smaller features on a substrate than a lithographic apparatus which uses, for example, radiation with a wavelength of 193 nm.

Low-$k_1$ lithography may be used to process features with dimensions smaller than the classical resolution limit of a lithographic apparatus. In such process, the resolution formula may be expressed as $CD=k_1 \times \lambda/NA$, where $\lambda$ is the wavelength of radiation employed, NA is the numerical aperture of the projection optics in the lithographic apparatus, CD is the "critical dimension" (generally the smallest feature size printed, but in this case half-pitch) and $k_1$ is an empirical resolution factor. In general, the smaller $k_1$ the more difficult it becomes to reproduce the pattern on the substrate that resembles the shape and dimensions planned by a circuit designer in order to achieve particular electrical functionality and performance. To overcome these difficulties, sophisticated fine-tuning steps may be applied to the lithographic projection apparatus and/or design layout. These include, for example, but not limited to, optimization of NA, customized illumination schemes, use of phase shifting patterning devices, various optimization of the design layout such as optical proximity correction (OPC, sometimes also referred to as "optical and process correction") in the design layout, or other methods generally defined as "resolution enhancement techniques" (RET). Alternatively, tight control loops for controlling a stability of the lithographic apparatus may be used to improve reproduction of the pattern at low k1.

Metrology tools are used in many aspects of the IC manufacturing process, for example as alignment tools for proper positioning of a substrate prior to an exposure and scatterometry based tools for inspecting/measuring the exposed and/or etched product in process control; e.g., to measure overlay.

To perform metrology, a measurement recipe comprising a number of metrology settings, such as illumination settings, should be selected as these typically affect the measurement quality. It would be desirable to improve on determination methods of determining a measurement recipe.

SUMMARY

In a first aspect of the invention there is provided a method for determining a measurement recipe describing measurement settings for measuring a parameter of interest from a substrate subject to an etch induced parameter error, said etch induced parameter error affecting measurement of the parameter of interest in a recipe dependent manner; the method comprising: obtaining parameter of interest set-up data relating to measurements of at least one set-up substrate on which the parameter of interest has various first induced set values; obtaining etch induced parameter set-up data relating to measurements of at least one set-up substrate on which the etch induced parameter has various second induced set values; and determining the recipe to minimize the effect of the etch induced parameter on measurement of the parameter of interest.

Also disclosed is a computer program, alignment sensor and a lithographic apparatus being operable to perform the method of the first aspect.

The above and other aspects of the invention will be understood from a consideration of the examples described below.

BRIEF DESCRIPTION OF THE DRAWINGS

Embodiments of the invention will now be described, by way of example only, with reference to the accompanying schematic drawings, in which.

DETAILED DESCRIPTION

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range of about 5-100 nm).

The term "reticle", "mask" or "patterning device" as employed in this text may be broadly interpreted as referring to a generic patterning device that can be used to endow an incoming radiation beam with a patterned cross-section, corresponding to a pattern that is to be created in a target portion of the substrate. The term "light valve" can also be used in this context. Besides the classic mask (transmissive or reflective, binary, phase-shifting, hybrid, etc.), examples of other such patterning devices include a programmable mirror array and a programmable LCD array.

Figure 1:
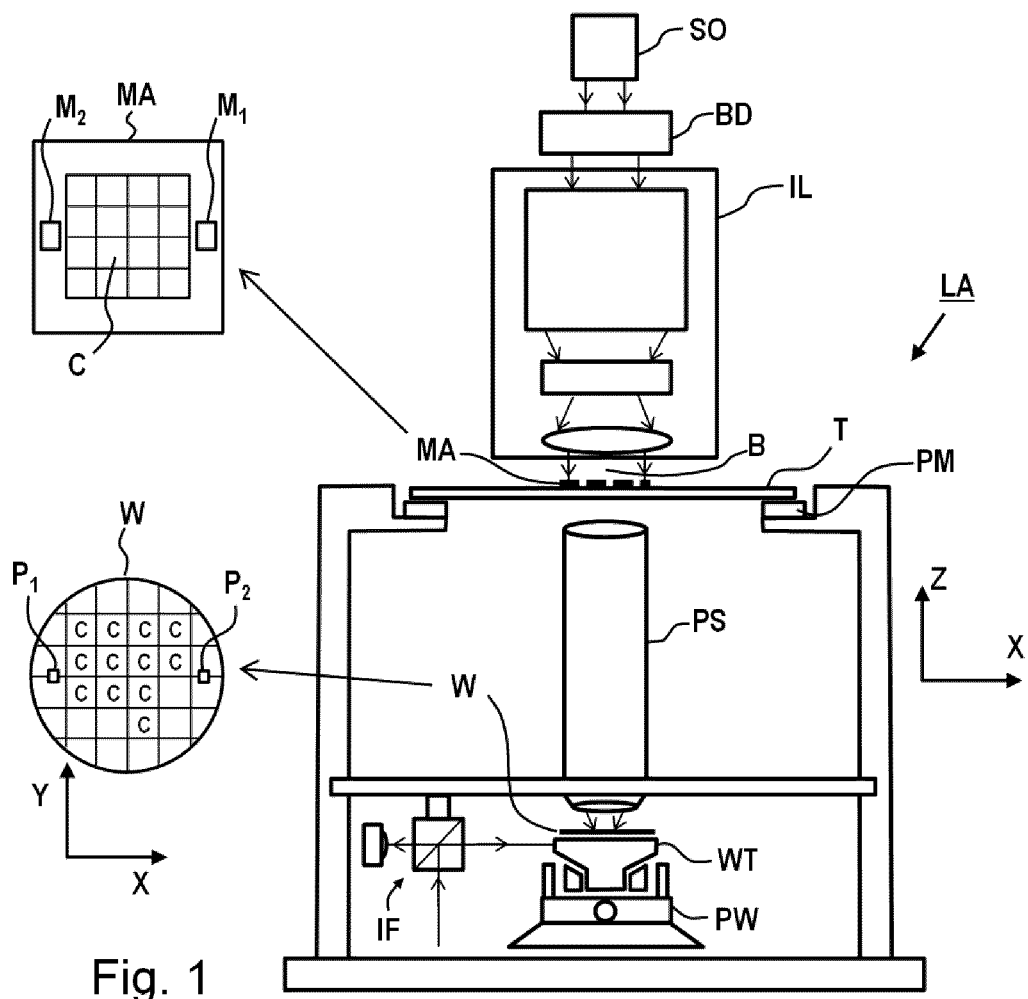
FIG. 1 depicts a schematic overview of a lithographic apparatus.

FIG. 1 schematically depicts a lithographic apparatus LA or scanner (the two terms are used synonymously, although the concepts herein may also be applicable to stepper arrangement's). The lithographic apparatus LA includes an illumination system (also referred to as illuminator) IL configured to condition a radiation beam B (e.g., UV radiation, DUV radiation or EUV radiation), a mask support (e.g., a mask table) MT constructed to support a patterning device (e.g., a mask) MA and connected to a first positioner PM configured to accurately position the patterning device MA in accordance with certain parameters, a substrate support (e.g., a wafer table) WT constructed to hold a substrate (e.g., a resist coated wafer) W and connected to a second positioner PW configured to accurately position the substrate support in accordance with certain parameters, and a projection system (e.g., a refractive projection lens system) PS configured to project a pattern imparted to the radiation beam B by patterning device MA onto a target portion C (e.g., comprising one or more dies) of the substrate W.

In operation, the illumination system IL receives a radiation beam from a radiation source SO, e.g. via a beam delivery system BD. The illumination system IL may include various types of optical components, such as refractive, reflective, magnetic, electromagnetic, electrostatic, and/or other types of optical components, or any combination thereof, for directing, shaping, and/or controlling radiation. The illuminator IL may be used to condition the radiation beam B to have a desired spatial and angular intensity distribution in its cross section at a plane of the patterning device MA.

The term "projection system" PS used herein should be broadly interpreted as encompassing various types of projection system, including refractive, reflective, catadioptric, anamorphic, magnetic, electromagnetic and/or electrostatic optical systems, or any combination thereof, as appropriate for the exposure radiation being used, and/or for other factors such as the use of an immersion liquid or the use of a vacuum. Any use of the term "projection lens" herein may be considered as synonymous with the more general term "projection system" PS.

The lithographic apparatus LA may be of a type wherein at least a portion of the substrate may be covered by a liquid having a relatively high refractive index, e.g., water, so as to fill a space between the projection system PS and the substrate W—which is also referred to as immersion lithography. More information on immersion techniques is given in U.S. Pat. No. 6,952,253, which is incorporated herein by reference.

The lithographic apparatus LA may also be of a type having two or more substrate supports WT (also named "dual stage"). In such "multiple stage" machine, the substrate supports WT may be used in parallel, and/or steps in preparation of a subsequent exposure of the substrate W may be carried out on the substrate W located on one of the substrate support WT while another substrate W on the other substrate support WT is being used for exposing a pattern on the other substrate W.

In addition to the substrate support WT, the lithographic apparatus LA may comprise a measurement stage. The measurement stage is arranged to hold a sensor and/or a cleaning device. The sensor may be arranged to measure a property of the projection system PS or a property of the radiation beam B. The measurement stage may hold multiple sensors. The cleaning device may be arranged to clean part of the lithographic apparatus, for example a part of the projection system PS or a part of a system that provides the immersion liquid. The measurement stage may move beneath the projection system PS when the substrate support WT is away from the projection system PS.

In operation, the radiation beam B is incident on the patterning device, e.g. mask, MA which is held on the mask support MT, and is patterned by the pattern (design layout) present on patterning device MA. Having traversed the mask MA, the radiation beam B passes through the projection system PS, which focuses the beam onto a target portion C of the substrate W. With the aid of the second positioner PW and a position measurement system IF, the substrate support WT can be moved accurately, e.g., so as to position different target portions C in the path of the radiation beam B at a focused and aligned position. Similarly, the first positioner PM and possibly another position sensor (which is not explicitly depicted in FIG. 1) may be used to accurately position the patterning device MA with respect to the path of the radiation beam B. Patterning device MA and substrate W may be aligned using mask alignment marks M1, M2 and substrate alignment marks P1, P2. Although the substrate alignment marks P1, P2 as illustrated occupy dedicated target portions, they may be located in spaces between target portions. Substrate alignment marks P1, P2 are known as scribe-lane alignment marks when these are located between the target portions C.

Figure 2:
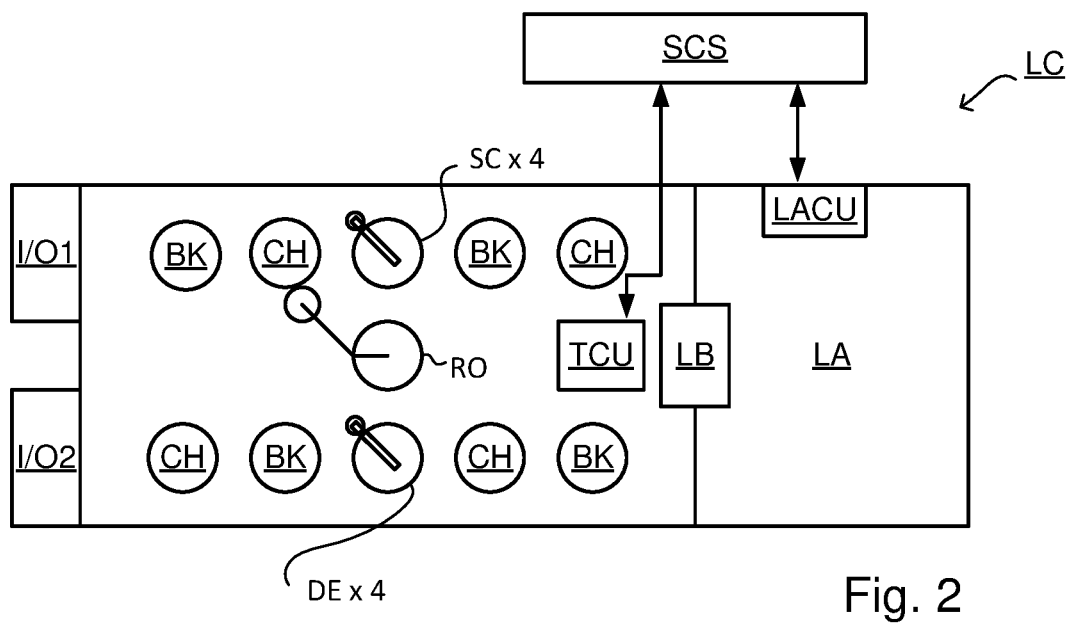
FIG. 2 depicts a schematic overview of a lithographic cell.

As shown in FIG. 2 the lithographic apparatus LA may form part of a lithographic cell LC, also sometimes referred to as a lithocell or (litho)cluster, which often also includes apparatus to perform pre- and post-exposure processes on a substrate W. Conventionally these include spin coaters SC to deposit resist layers, developers DE to develop exposed resist, chill plates CH and bake plates BK, e.g. for conditioning the temperature of substrates W e.g. for conditioning solvents in the resist layers. A substrate handler, or robot, RO picks up substrates W from input/output ports I/O1, I/O2, moves them between the different process apparatus and delivers the substrates W to the loading bay LB of the lithographic apparatus LA. The devices in the lithocell, which are often also collectively referred to as the track, are typically under the control of a track control unit TCU that in itself may be controlled by a supervisory control system SCS, which may also control the lithographic apparatus LA, e.g. via lithography control unit LACU.

In order for the substrates W exposed by the lithographic apparatus LA to be exposed correctly and consistently, it is desirable to inspect substrates to measure properties of patterned structures, such as overlay errors between subsequent layers, line thicknesses, critical dimensions (CD), etc. For this purpose, inspection tools (not shown) may be included in the lithocell LC. If errors are detected, adjustments, for example, may be made to exposures of subsequent substrates or to other processing steps that are to be performed on the substrates W, especially if the inspection is done before other substrates W of the same batch or lot are still to be exposed or processed.

An inspection apparatus, which may also be referred to as a metrology apparatus, is used to determine properties of the substrates W, and in particular, how properties of different substrates W vary or how properties associated with different layers of the same substrate W vary from layer to layer. The inspection apparatus may alternatively be constructed to identify defects on the substrate W and may, for example, be part of the lithocell LC, or may be integrated into the lithographic apparatus LA, or may even be a stand-alone device. The inspection apparatus may measure the properties on a latent image (image in a resist layer after the exposure), or on a semi-latent image (image in a resist layer after a post-exposure bake step PEB), or on a developed resist image (in which the exposed or unexposed parts of the resist have been removed), or even on an etched image (after a pattern transfer step such as etching).

Figure 3:
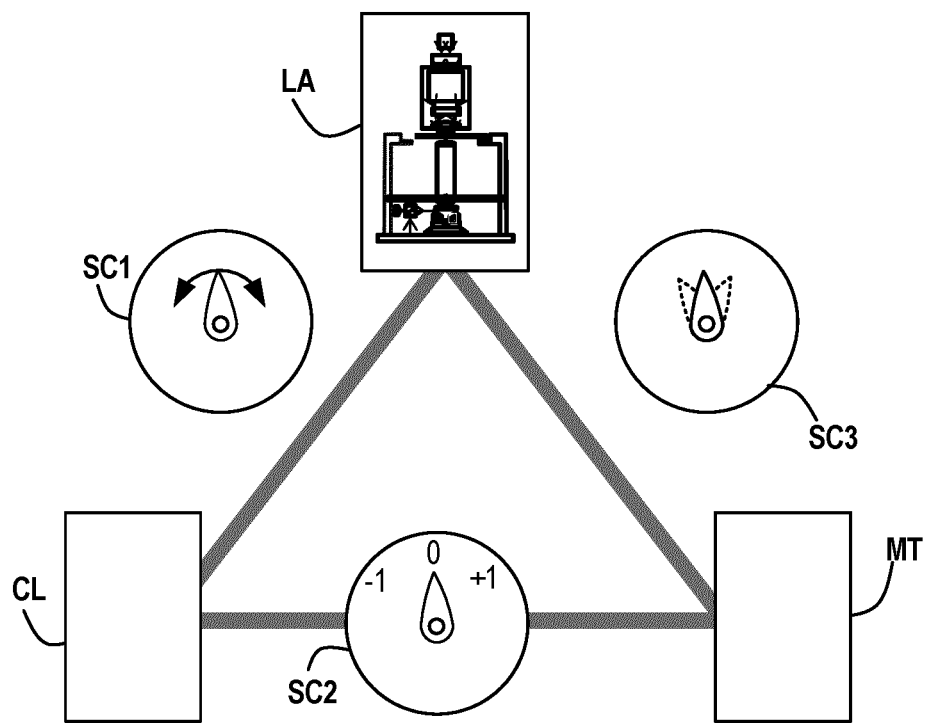
FIG. 3 depicts a schematic representation of holistic lithography, representing a cooperation between three key technologies to optimize semiconductor manufacturing.

Typically the patterning process in a lithographic apparatus LA is one of the most critical steps in the processing which requires high accuracy of dimensioning and placement of structures on the substrate W. To ensure this high accuracy, three systems may be combined in a so called "holistic" control environment as schematically depicted in FIG. 3. One of these systems is the lithographic apparatus LA which is (virtually) connected to a metrology tool MT (a second system) and to a computer system CL (a third system). The key of such "holistic" environment is to optimize the cooperation between these three systems to enhance the overall process window and provide tight control loops to ensure that the patterning performed by the lithographic apparatus LA stays within a process window. The process window defines a range of process parameters (e.g. dose, focus, overlay) within which a specific manufacturing process yields a defined result (e.g. a functional semiconductor device)—typically within which the process parameters in the lithographic process or patterning process are allowed to vary.

The computer system CL may use (part of) the design layout to be patterned to predict which resolution enhancement techniques to use and to perform computational lithography simulations and calculations to determine which mask layout and lithographic apparatus settings achieve the largest overall process window of the patterning process (depicted in FIG. 3 by the double arrow in the first scale SC1). Typically, the resolution enhancement techniques are arranged to match the patterning possibilities of the lithographic apparatus LA. The computer system CL may also be used to detect where within the process window the lithographic apparatus LA is currently operating (e.g. using input from the metrology tool MT) to predict whether defects may be present due to e.g. sub-optimal processing (depicted in FIG. 3 by the arrow pointing "0" in the second scale SC2).

The metrology tool MT may provide input to the computer system CL to enable accurate simulations and predictions, and may provide feedback to the lithographic apparatus LA to identify possible drifts, e.g. in a calibration status of the lithographic apparatus LA (depicted in FIG. 3 by the multiple arrows in the third scale SC3).

In lithographic processes, it is desirable to make frequently measurements of the structures created, e.g., for process control and verification. Tools to make such measurement are typically called metrology tools MT. Different types of metrology tools MT for making such measurements are known, including scanning electron microscopes or various forms of scatterometer metrology tools MT. Scatterometers are versatile instruments which allow measurements of the parameters of a lithographic process by having a sensor in the pupil or a conjugate plane with the pupil of the objective of the scatterometer, measurements usually referred as pupil based measurements, or by having the sensor in the image plane or a plane conjugate with the image plane, in which case the measurements are usually referred as image or field based measurements. Such scatterometers and the associated measurement techniques are further described in patent applications US20100328655, US2011102753A1, US20120044470A, US20110249244, US20110026032 or EP1,628,164A, incorporated herein by reference in their entirety. Aforementioned scatterometers may measure gratings using light from soft x-ray and visible to near-IR wavelength range.

In a first embodiment, the scatterometer MT is an angular resolved scatterometer. In such a scatterometer reconstruction methods may be applied to the measured signal to reconstruct or calculate properties of the grating. Such reconstruction may, for example, result from simulating interaction of scattered radiation with a mathematical model of the target arrangement and comparing the simulation results with those of a measurement. Parameters of the mathematical model are adjusted until the simulated interaction produces a diffraction pattern similar to that observed from the real target.

In a second embodiment, the scatterometer MT is a spectroscopic scatterometer MT. In such spectroscopic scatterometer MT, the radiation emitted by a radiation source is directed onto the target and the reflected or scattered radiation from the target is directed to a spectrometer detector, which measures a spectrum (i.e. a measurement of intensity as a function of wavelength) of the specular reflected radiation. From this data, the structure or profile of the target giving rise to the detected spectrum may be reconstructed, e.g. by Rigorous Coupled Wave Analysis and non-linear regression or by comparison with a library of simulated spectra.

In a third embodiment, the scatterometer MT is a ellipsometric scatterometer. The ellipsometric scatterometer allows for determining parameters of a lithographic process by measuring scattered radiation for each polarization states. Such metrology apparatus emits polarized light (such as linear, circular, or elliptic) by using, for example, appropriate polarization filters in the illumination section of the metrology apparatus. A source suitable for the metrology apparatus may provide polarized radiation as well. Various embodiments of existing ellipsometric scatterometers are described in U.S. patent application Ser. Nos. 11/451,599, 11/708,678, 12/256,780, 12/486,449, 12/920,968, 12/922, 587, 13/000,229, 13/033,135, 13/533,110 and 13/891,410 incorporated herein by reference in their entirety.

Figure 4:
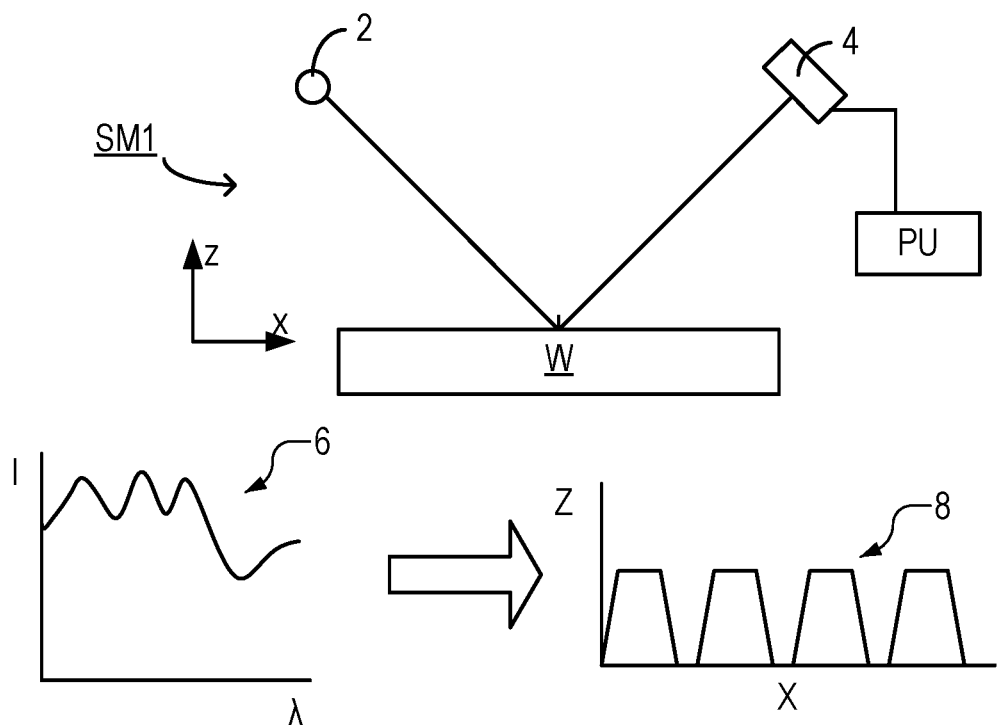
FIG. 4 depicts a schematic overview of a scatterometry apparatus used as a metrology device, for use in methods according to embodiments of the invention.

A metrology apparatus, such as a scatterometer, is depicted in FIG. 4. It comprises a broadband (white light) radiation projector 2 which projects radiation onto a substrate W. The reflected or scattered radiation is passed to a spectrometer detector 4, which measures a spectrum 6 (i.e. a measurement of intensity as a function of wavelength) of the specular reflected radiation. From this data, the structure or profile 8 giving rise to the detected spectrum may be reconstructed by processing unit PU, e.g. by Rigorous Coupled Wave Analysis and non-linear regression or by comparison with a library of simulated spectra as shown at the bottom of FIG. 3. In general, for the reconstruction, the general form of the structure is known and some parameters are assumed from knowledge of the process by which the structure was made, leaving only a few parameters of the structure to be determined from the scatterometry data. Such a scatterometer may be configured as a normal-incidence scatterometer or an oblique-incidence scatterometer.

FIG. 5(a) presents an embodiment of a metrology apparatus and, more specifically, a dark field scatterometer. A target T and diffracted rays of measurement radiation used to illuminate the target are illustrated in more detail in FIG. 5(b). The metrology apparatus illustrated is of a type known as a dark field metrology apparatus. The metrology apparatus may be a stand-alone device or incorporated in either the lithographic apparatus LA, e.g., at the measurement station, or the lithographic cell LC. An optical axis, which has several branches throughout the apparatus, is represented by a dotted line O. In this apparatus, light emitted by source 11 (e.g., a xenon lamp) is directed onto substrate W via a beam splitter 15 by an optical system comprising lenses 12, 14 and objective lens 16. These lenses are arranged in a double sequence of a 4F arrangement. A different lens arrangement can be used, provided that it still provides a substrate image onto a detector, and simultaneously allows for access of an intermediate pupil-plane for spatial-frequency filtering. Therefore, the illumination angles can be designed or adjusted so that the first order rays entering the objective lens are closely aligned with the central optical axis. The rays illustrated in FIGS. 5(a) and 3(b) are shown somewhat off axis, purely to enable them to be more easily distinguished in the diagram.

At least the 0 and +1 orders diffracted by the target T on substrate W are collected by objective lens 16 and directed back through beam splitter 15. Returning to FIG. 5(a), both the first and second illumination modes are illustrated, by designating diametrically opposite apertures labeled as north (N) and south (S). When the incident ray I of measurement radiation is from the north side of the optical axis, that is when the first illumination mode is applied using aperture plate 13N, the +1 diffracted rays, which are labeled +1(N), enter the objective lens 16. In contrast, when the second illumination mode is applied using aperture plate 13S the −1 diffracted rays (labeled 1(S)) are the ones which enter the lens 16.

A second beam splitter 17 divides the diffracted beams into two measurement branches. In a first measurement branch, optical system 18 forms a diffraction spectrum (pupil plane image) of the target on first sensor 19 (e.g. a CCD or CMOS sensor) using the zeroth and first order diffractive beams. Each diffraction order hits a different point on the sensor, so that image processing can compare and contrast orders. The pupil plane image captured by sensor 19 can be used for focusing the metrology apparatus and/or normalizing intensity measurements of the first order beam. The pupil plane image can also be used for many measurement purposes such as reconstruction. The concepts disclosed herein relate to pupil measurements using this branch.

Figure 5:
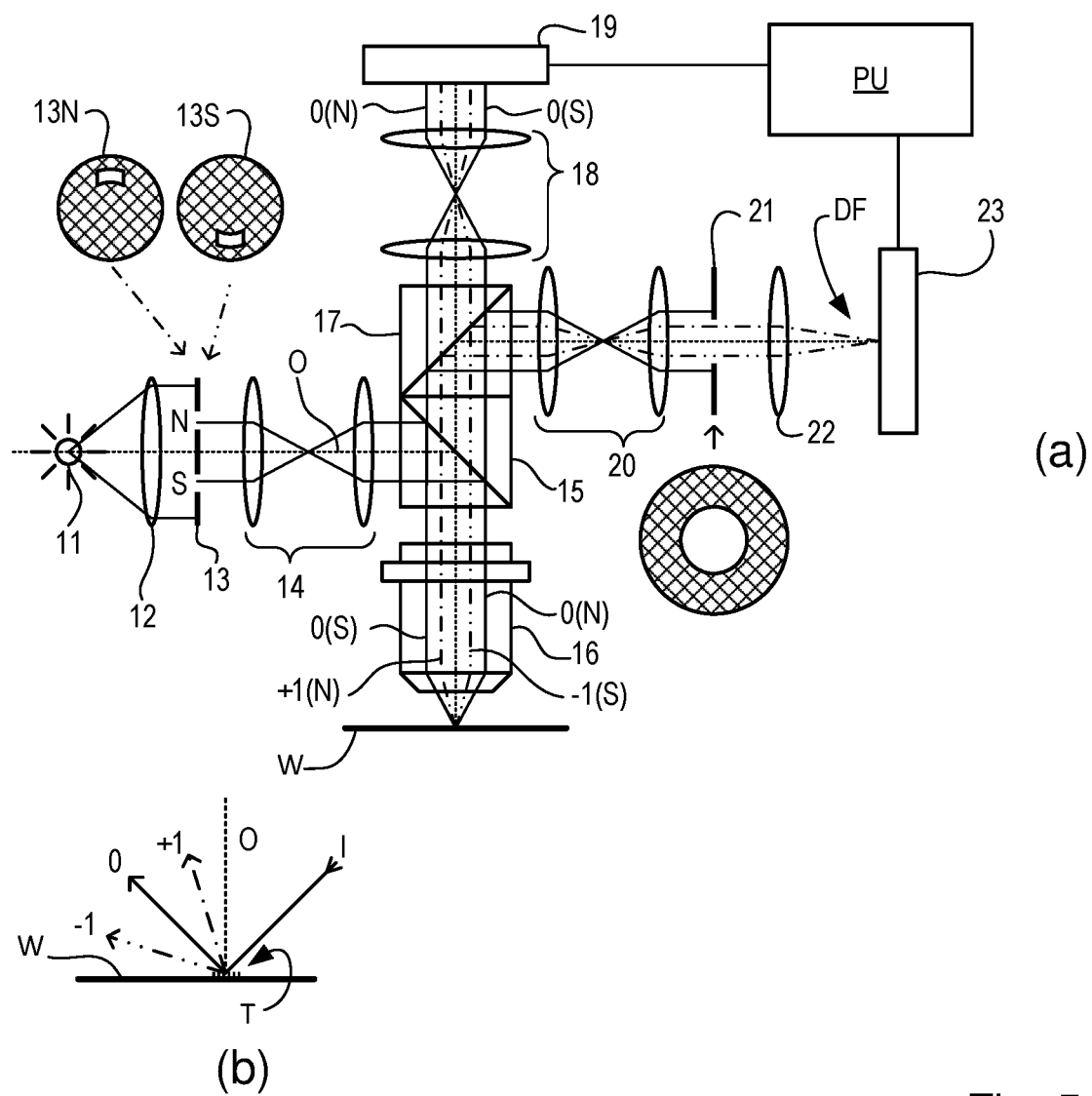
FIG. 5 comprises (a) a schematic diagram of a pupil and dark field scatterometer for use in methods according to embodiments of the invention using a first pair of illumination apertures, and (b) a detail of diffraction spectrum of a target grating for a given direction of illumination.

In the second measurement branch, optical system 20, 22 forms an image of the target T on sensor 23 (e.g. a CCD or CMOS sensor). In the second measurement branch, an aperture stop 21 is provided in a plane that is conjugate to the pupil-plane. Aperture stop 21 functions to block the zeroth order diffracted beam so that the image of the target formed on sensor 23 is formed only from the −1 or +1 first order beam. The images captured by sensors 19 and 23 are output to processor PU which processes the image, the function of which will depend on the particular type of measurements being performed. Note that the term 'image' is used here in a broad sense. An image of the grating lines as such will not be formed, if only one of the −1 and +1 orders is present. The particular forms of aperture plate 13 and field stop 21 shown in FIG. 5 are purely examples.

The metrology tools described above may be used to measure overlay in-device using the zeroth order response (pupil) after-etch. This method is currently known as In-Device-Metrology OV (IDM OV). The main functional requirement of IDM is that the target under measurement comprises asymmetry when an overlay error exists. By monitoring the induced asymmetry in the zeroth order pupil, IDM can measure the existing overlay.

To measure the overlay, a recipe needs to be created, which should only be sensitive to the overlay of interest, and robust to process variations and other asymmetries. Due to the cross-polarization, many acquisition settings (wavelength, grating-to-sensor rotations and polarizations) may result in a recipe that shows sensitivity for the OV of interest. Unfortunately, many of these recipes may measure a different wafer map for the same wafer, with large point-to-point differences. This phenomenon is in particular observed for the more complex structures as the bit-line placement in DRAM (GBL), storage node placement (SN), and 3DNAND. Therefore, it is expected that the main reason for the large diversity in wafer maps is caused by asymmetries in the structure other than the overlay(s) of interest, as such asymmetry is known to exist in these structures. In addition, the sensor also induces wafer maps, which may also be dependent on the acquisition strategy. One of the key performance indicators (KPI) in the IDM recipe creation is a quantification of the crosstalk in an IDM recipe. The crosstalk indicates how much the recipe is susceptible to changes in different layers. For example, a recipe to measure the bit line OV, may be susceptible to other overlays, e.g., bit line contact OV, DRAM OV etc.

Two major contributors to asymmetry in the pupil are overlay (e.g., the overlay of interest or parameter of interest) and etch-induced tilt. Certain etching techniques, such as deep-silicon etching, may cause a radial misalignment between frontside and backside of the wafer which is intrinsically coupled to the plasma etching process itself (rather than the exposure process), and which is known as tilt error or simply tilt.

Although a KPI exists for quantifying the amount of crosstalk with tilt for a given recipe, a method to suppress the crosstalk has not been identified other than using different acquisition settings (WLs/polarizations/wafer rotation). Since this crosstalk deteriorates the recipe accuracy, a method is desirable for suppressing the crosstalk. This crosstalk will mainly show up on the edge of the wafer; a substantial IDM accuracy penalty on overlay measurements has been observed; e.g., errors in the region of 10 nm or more at the edge of the wafer, which are believed to be because of crosstalk with tilt.

In order to reduce crosstalk between these two major contributors of asymmetry in the pupil it is proposed to extend IDM recipe setup with tilt analysis, so as to disentangle any measured asymmetry which is tilt induced from measurements of a parameter of interest (e.g., overlay; more specifically an overlay of interest such as an overlay of a particular layer or structure). The proposed IDM recipe set may also disentangle this overlay of interest from other sources of pupil asymmetries such as other overlays (e.g., overlay of other layers or structures).

The proposed method may comprise, in a set up phase, inducing set errors for an etch induced parameter (e.g., tilt errors) on a recipe set-up wafer (or design of experiments wafer), in addition to inducing set overlay errors in the scanner on the same or another recipe set-up wafer (or design of experiments wafer). By having two controllable input parameters for design of experiment (DoE) in IDM recipe setup, it becomes possible to significantly reduce crosstalk between overlay and tilt.

Figure 6:
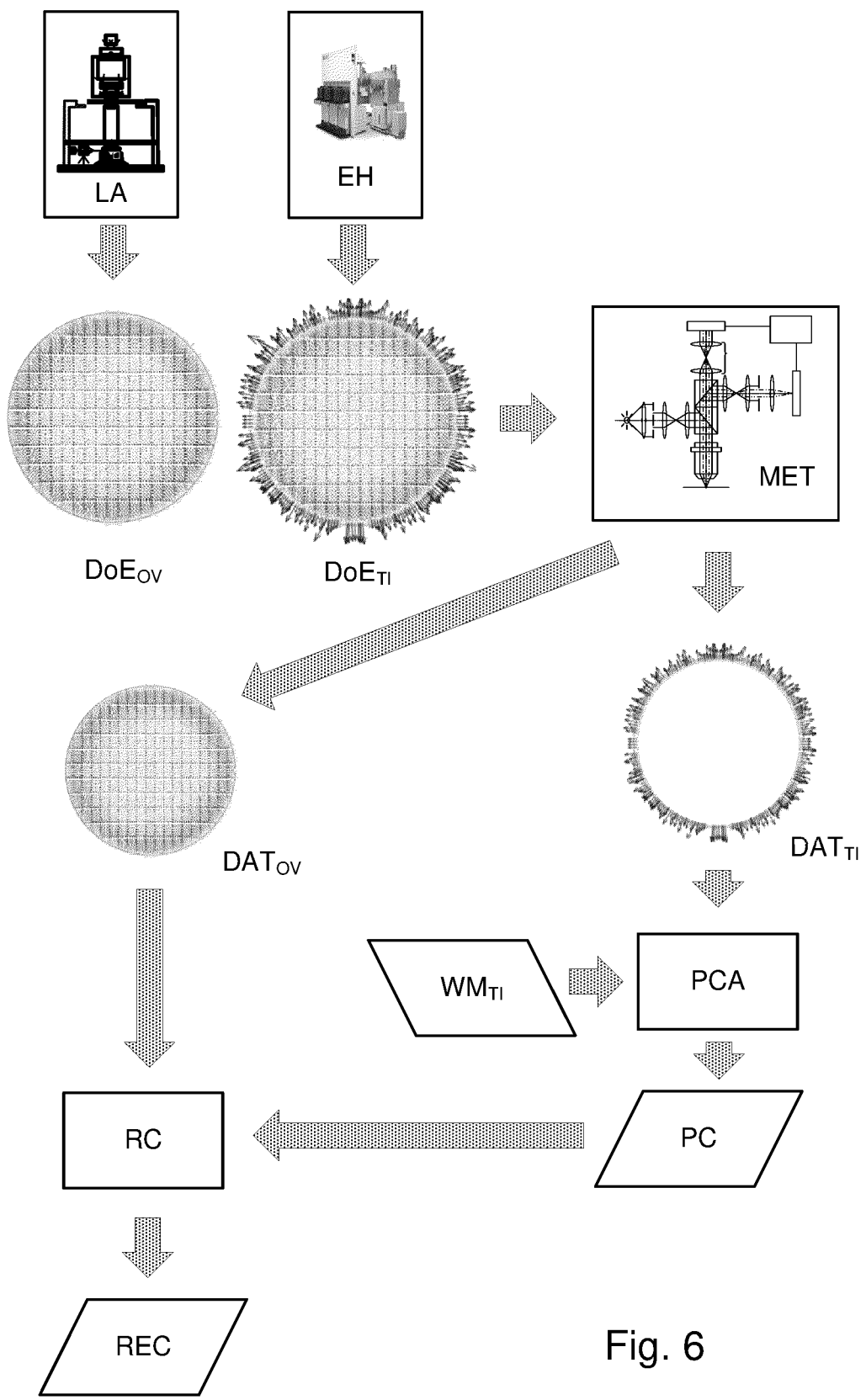
FIG. 6 depicts a flow diagram describing a method according to an embodiment of the invention.

FIG. 6 conceptually illustrates such a recipe creation method. A scanner LA is used to create (at least) one DoE wafer DoE$_{OV}$ having one or more scanner induced OV. This may include only induced overlay for the overlay of interest (e.g., having variation in this overlay over the wafer). Alternatively, this step may include inducing overlay for other overlay parameters relating to other layers or structures (on the same wafer or on different wafers of this set of wafers DoE$_{OV}$), thereby enabling disentanglement of the overlay of interest from other overlays in addition to tilt.

An etcher EH is used to create (at least) one DoE wafer DoE$_{ti}$ with etcher induced tilt; (e.g., having variation in tilt over the wafer). It should be appreciated that these scanner and etcher steps may be combined insofar as they are performed on one wafer or one set of wafers. As such, instead of (or in addition to) separate DoE wafer(s) DoE$_{OV}$ and DoE wafer(s) DoE$_{TI}$, a single DoE wafer or set of wafers may be provided having etcher induced tilt at the edge or peripheral area of the wafer and one or more scanner induced OV in a central area of the wafer.

A metrology device MET is used to measure the wafers DoE$_{OV}$, DoE$_{TI}$, so as to obtain training data comprising overlay data DAT$_{OV}$ relating to the wafers DoE$_{OV}$ for which the overlay of interest (at least) is varied and tilt data DAT$_{TI}$ relating to the wafers DoE$_{TI}$ for which tilt is varied. The latter may relate to measurements at only, or predominately at the edge of the wafer where tilt error is dominant. The overlay data DAT$_{OV}$ and tilt data DAT$_{TI}$ will also comprise the known set-values of the scanner induced overlay and the etch induced tilt.

A component analysis step is performed on the tilt data DAT$_{TI}$. This step may comprise, for example, applying a principal component analysis PCA to this data. e.g., relating to targets with the etcher induced tilt, so as to estimate pupil response to tilt. PCA is a statistical technique to identify the directions of highest variation (principal components) in a high-dimensional dataset. This step may comprise using tilt wafer map data WM$_{TI}$ describing an expected tilt wafer map (e.g., based on the knowledge described below and/or from experiment) to select one of the principal component(s) which show one or more similar wafer maps. The selecting of one or more components which are similar to known/expected patterns (wafer maps) may comprise selecting a principal component for which its resemblance to the known pattern is above a threshold resemblance metric; and/or selecting one or more components which has the highest resemblance of all the principal components according to a metric.

It should be noted that PCA is only one example of a data analysis method which may be used; any other suitable a data analysis method which is able to determine the tilt wafer map may be used instead. For example, independent component analysis (ICA), or more generally, other blind signal separation techniques may be used. There are many of these algorithms available, as the person skilled in the art will be aware, and would know how to estimate the tilt using any of these.

Alternatively, or in addition, tilt data (e.g., from a 3DNAND structure) may be measured by a SEM. Therefore, it is possible to obtain tilt data from another reference source. Therefore, in an embodiment, it is proposed that, where such a reference for the tilt is available, this reference is used; if not than any of the aforementioned blind signal separation techniques to estimate the tilt may be used. In the first case, the cost function changes a bit (I will add it below), but the idea remains the same: use the tilt information to make a recipe robust to tilt.

In a recipe creation step RC, the selected principal component(s) PC and/or pupil response to tilt are used determine an overlay recipe REC which is robust (has low or no sensitivity) to tilt; e.g., the recipe comprises weights which are robust to tilt response.

To make a recipe robust to tilt in last step, one could add an additional penalty to a cost function used in determining the recipe weights:

$$w_{opt} = \arg\min_{w} \|P^T w - s\|^2 + \alpha \|w^T E\|^2$$

where P is a matrix comprising the pupil(s) of a target within each column (i.e., the measured pupils) $P^T w$ corresponds to a vector comprising the "get-values" (OV values obtained by the recipe), s are the set-values (e.g. from scanner or etcher or measured using e.g., an SEM). The second term is a penalty term which penalizes crosstalk between the overlay of interest and tilt: E is a matrix comprising one or more principal components of the tilt data obtained in step PCA (e.g., those which correspond closest to an expected pattern). The parameter $\alpha$ controls the penalty.

If SEM data is available, the cost function slightly changes:

$$w_{opt} = \arg\min_{w} \|P^T w - s\|^2 + \beta \|(w^T P)t\|^2,$$

where t is a vector containing the tilt obtained by a reference. Basically, the cost function attempts to ensure that the "get-values" do not resemble the tilt (it tries to make the "get-values" orthogonal to the tilt measurements controlled by parameter $\beta$).

As such, the cost function determines weights for the measured values which are a good match to the set-values (1st term) while being robust to tilt (2nd penalty term). More specifically, the cost function determines a weighting for (e.g., a vector describing) measured values of a parameter of interest so as to minimize a difference between the measured values and induced set values for the parameter of interest while comprising a penalty term which penalizes crosstalk between the parameter of interest and a tilt parameter; e.g., penalizes solutions for which there is a likelihood of a significant tilt impact (e.g., the solution corresponds to an expected tilt pattern or fingerprint).

Above a simple linear regression is used as an example to make a recipe robust to tilt. However, the method can easily be generalized to more sophisticated regression techniques such as neural networks (deep learning), i.e. the cost function can easily be adapted to penalize the tilt during the training of the neural network. Since neural networks are well known in the art, they will not be described here in detail.

In this manner, a method is described which suppresses crosstalk of overlay with tilt, so as to increase the number of in-spec targets (e.g., at the edge of the wafer) and therefore increase the yield.

Figure 7:
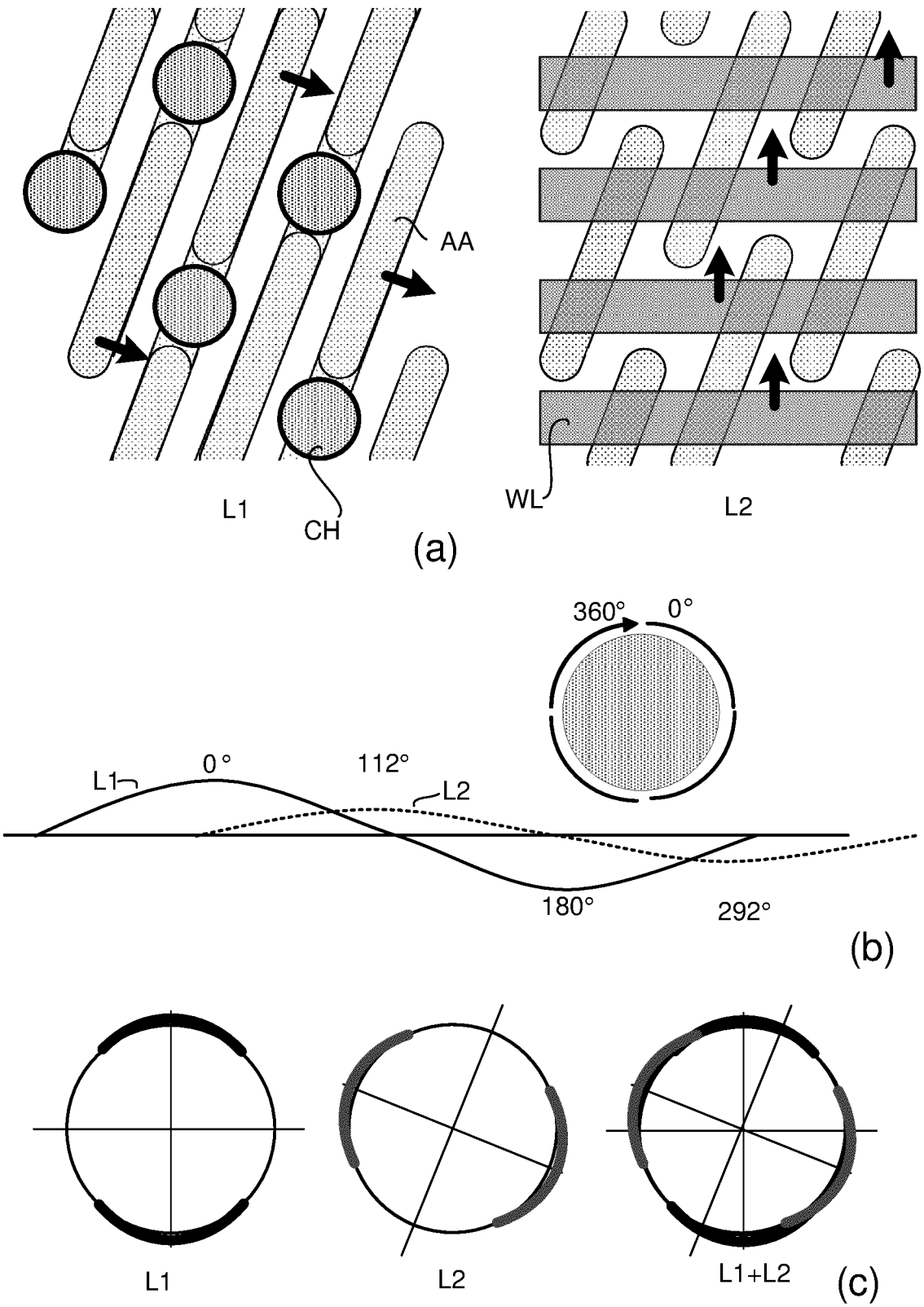
FIG. 7 depicts the expected pattern or fingerprint which may be observed due to etch induced tilt.

As stated, the method comprises choosing principal components which correspond to an expected tilt pattern. FIG. 7 illustrates what such an expected tilt pattern might look like. Etcher tilt is a radially symmetric phenomenon. The impact of etcher tilt on overlay may be different for top and bottom structures; the impact of etcher tilt on pattern shift of a line is perpendicular to the line. This results in the resulting shape in overlay having a sinus behavior over the circumference of the wafer.

In FIG. 7(a), a particular (e.g., memory) structure is shown comprising in layer L1, periodic tilted (oblique) active areas AA and cut holes CH which define cuts for the active areas, and in layer L2, word lines WL which correspond with the cuts. The arrows indicate the direction of tilt error for each layer (e.g., perpendicular to the periodicity of the layer). FIG. 7(b) is a graph of tilt error magnitude (y axis) against peripheral angle on the wafer (x axis—0-360 degrees) for these two layers. The sinus behavior of the tilt error is evident; for this specific layer pair the tilt amplitude of bottom grating is)sin(22°)*amplitude of top grating at tilt induced pattern shifts. FIG. 7(c) shows the tangential behavior of tilt on overlay for layers L1 and L2, and the combined effect. The two impacts can enhance each other (same sign) or compensate each other (opposite sign). Other layer combinations or tilt error for cut etches will show similar sinus patterns for tilt error, although different angles for the different layers will mean that the actual shapes will vary (in a generally predictable manner).

Further embodiments are disclosed in the subsequent numbered clauses:

1. A method for determining a measurement recipe describing measurement settings for measuring a parameter of interest from a substrate subject to an etch induced parameter error, said etch induced parameter error affecting measurement of the parameter of interest in a recipe dependent manner; the method comprising:
obtaining parameter of interest set-up data relating to measurements of at least one set-up substrate on which the parameter of interest has various first induced set values;
obtaining etch induced parameter set-up data relating to measurements of at least one set-up substrate on which the etch induced parameter has various second induced set values; and determining the recipe to minimize the effect of the etch induced parameter on measurement of the parameter of interest.

2. A method as defined in clause 1, wherein the step of determining the recipe comprises penalizing solutions for said recipe according to a resemblance to known patterns for said etch induced parameter error.

3. A method as defined in clause 2, wherein the method comprises performing a blind signal separation analysis on said etch induced parameter set-up data to obtain components of said etch induced parameter set-up data; and
penalizing solutions for said recipe corresponding to said components which have high resemblance to said known patterns.

4. A method as defined in clause 3, comprising selecting one or more components with high resemblance for said penalizing step by one or both of:
selecting one or more components for which the resemblance for the component is above a threshold resemblance metric; and
selecting one or more components which has the highest resemblance of all components according to a metric.

5. A method as defined in clause 3 or 4, wherein the blind signal separation analysis comprises a principal component analysis or independent component analysis, and said components comprise principal components or independent components as appropriate.

6. A method as defined in any of clauses 3 to 5, wherein the blind signal separation analysis is applied to the etch induced parameter set-up data measured at a peripheral region of said at least one set-up substrate.

7. A method as defined in clause 2, wherein the method comprises obtaining said etch induced parameter set-up data from a reference measurement source, optionally a scanning electron microscope.

8. A method as defined in any of clauses 2 to 7, wherein said determining step further comprises determining weights which minimize a difference between the parameter of interest set up data values and first induced set values, subject to said penalizing.

9. A method as defined in any preceding clause, wherein the at least one set-up substrate on which the parameter of interest has various first induced set values and the at least one set-up substrate on which the etch induced parameter has various second induced set values comprises different at least one set-up substrates.

10. A method as defined in any of clauses 1 to 8, wherein the at least one set-up substrate on which the parameter of interest has various first induced set values and the at least one set-up substrate on which the etch induced parameter has various second induced set values comprises the same at least one set-up substrate; the first induced set values being induced in a central region of the at least one set-up substrate and the second induced set values being induced in a peripheral region of the at least one set-up substrate.

11. A method as defined in any preceding clause, wherein the parameter of interest comprises an overlay parameter of interest.

12. A method as defined in any preceding clause, wherein the etch induced parameter comprises etch induced tilt.

13. A method as defined in any preceding clause, comprising the steps of: producing the at least one set-up substrate on which the parameter of interest has various first induced set values, the first induced set values being induced via a lithographic exposure apparatus; and
producing the at least one set-up substrate on which the etch induced parameter has various second induced set values, the second induced set values being induced via an etch apparatus.

14. A method as defined in any preceding clause, using said measurement recipe to measure a parameter of interest on a product substrate.

15. A method as defined in clause 14, wherein said set-up substrates and product substrate each comprise functional circuit structures on which said measurements are performed.

16. A set-up substrate for use in the method of clauses 1 to 12, whereon an etch induced parameter has various second induced set values.

17. A set-up substrate as defined in clause 16, wherein the etch induced parameter comprises etch induced tilt.

18. A set-up substrate as defined in clause 16 or 17, wherein the second induced set values are induced in a peripheral region of the set-up substrate.

19. A set-up substrate as defined in clause 16 to 18, whereon a parameter of interest has various first induced set values and wherein the first induced set values are induced in a central region of the set-up substrate.

20. A computer program comprising program instructions operable to perform the method of any of clauses 1 to 12, when run on a suitable apparatus.

21. A non-transient computer program carrier comprising the computer program of clause 20.

22. A processing system comprising a processor and a storage device comprising the computer program of clause 21.

23. A metrology device comprising the processing system of clause 22, and being further operable to perform the method of clause 14 and 15.

Although specific reference may be made in this text to the use of lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

Although specific reference may be made in this text to embodiments of the invention in the context of a lithographic apparatus, embodiments of the invention may be used in other apparatus. Embodiments of the invention may form part of a mask inspection apparatus, a metrology apparatus, or any apparatus that measures or processes an object such as a wafer (or other substrate) or mask (or other patterning device). These apparatus may be generally referred to as lithographic tools. Such a lithographic tool may use vacuum conditions or ambient (non-vacuum) conditions.

Although specific reference may have been made above to the use of embodiments of the invention in the context of optical lithography, it will be appreciated that the invention, where the context allows, is not limited to optical lithography and may be used in other applications, for example imprint lithography.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

The invention claimed is:

1. A method for determining a measurement recipe describing one or more measurement settings for measuring a parameter of interest from a substrate subject to an etch induced parameter, the etch induced parameter affecting measurement of the parameter of interest in a recipe dependent manner, the method comprising:
obtaining parameter of interest set-up data relating to measurements of at least one set-up substrate on which the parameter of interest has various first induced set values;
obtaining etch induced parameter set-up data relating to measurements of at least one set-up substrate on which the etch induced parameter has various second induced set values associated with different etching conditions applied to the at least one set-up substrate; and
determining, based on the parameter of interest set-up data and etch induced parameter set-up data, the recipe to minimize or reduce the effect of the etch induced parameter on measurement of the parameter of interest.

2. The method as claimed in claim 1, wherein the determining the recipe comprises penalizing solutions for the recipe according to a resemblance to one or more known patterns for the etch induced parameter.

3. The method as claimed in claim 2, further comprising:
performing a blind signal separation analysis on the etch induced parameter set-up data to obtain components of the etch induced parameter set-up data; and penalizing solutions for the recipe corresponding to one or more of the components which have high resemblance to the one or more known patterns.

4. The method as claimed in claim 3, further comprising selecting one or more of the components with high resemblance for the penalizing by one or both of:
selecting one or more of the components for which the resemblance for the respective component is above a threshold resemblance metric; or
selecting one or more of the components which has the highest resemblance of all components according to a metric.

5. The method as claimed in claim 3, wherein the blind signal separation analysis comprises a principal component analysis or independent component analysis, and the components comprise principal components or independent components as appropriate.

6. The method as claimed in claim 3, wherein the blind signal separation analysis is applied to the etch induced parameter set-up data measured at a peripheral region of the at least one set-up substrate.

7. The method as claimed in claim 2, comprising obtaining the etch induced parameter set-up data from a reference measurement source.

8. The method as claimed in claim 2, wherein the determining further comprises determining weights which minimize a difference between the parameter of interest set up data values and first induced set values, subject to the penalizing.

9. The method as claimed in claim 1, wherein the at least one set-up substrate on which the parameter of interest has various first induced set values and the at least one set-up substrate on which the etch induced parameter has various second induced set values comprises the same at least one set-up substrate, the first induced set values being induced in a central region of the at least one set-up substrate and the second induced set values being induced in a peripheral region of the at least one set-up substrate.

10. The method as claimed in claim 1, further comprising:
producing the at least one set-up substrate on which the parameter of interest has various first induced set values, the first induced set values being induced via a lithographic exposure apparatus; and
producing the at least one set-up substrate on which the etch induced parameter has various second induced set values, the second induced set values being induced via an etch apparatus.

11. The method as claimed in claim 1, further comprising using the measurement recipe to measure a parameter of interest on a product substrate.

12. The method as claimed in claim 11, wherein the at least one set-up substrate on which the parameter of interest has various first induced set values, the at least one set-up substrate on which the etch induced parameter has various second induced set values, and the product substrate each comprise functional circuit structures on which the measurements are performed.

13. A set-up substrate for use in the method of claim 1, whereon an etch induced parameter has various second induced set values.

14. The set-up substrate as claimed in claim 13, wherein the second induced set values are induced in a peripheral region of the set-up substrate.

15. The set-up substrate as claimed in claim 13, whereon a parameter of interest has various first induced set values and wherein the first induced set values are induced in a central region of the set-up substrate.

16. The method as claimed in claim 1, wherein the at least one set-up substrate on which the parameter of interest has various first induced set values and the at least one set-up substrate on which the etch induced parameter has various second induced set values comprises different at least one set-up substrates.

17. The method as claimed in claim 1, wherein the parameter of interest comprises an overlay parameter of interest.

18. The method as claimed in claim 1, wherein the etch induced parameter comprises etch induced tilt.

19. A non-transient computer program carrier comprising a computer program comprising program instructions, when run on a suitable apparatus, configured to cause the apparatus to at least:
- obtain parameter of interest set-up data relating to measurements of at least one set-up substrate on which a parameter of interest has various first induced set values;
- obtaining etch induced parameter set-up data relating to measurements of at least one set-up substrate on which an etch induced parameter has various second induced set values associated with different etching conditions applied to the at least one set-up substrate, the etch induced parameter affecting measurement of the parameter of interest in a measurement recipe dependent manner; and
- determine, based on the parameter of interest set-up data and etch induced parameter set-up data, a measurement recipe describing one or more measurement settings for measuring the parameter of interest from a substrate subject to the etch induced parameter error to minimize or reduce an effect of the etch induced parameter on measurement of the parameter of interest.

20. A metrology device comprising a detector and configured to cause the metrology device to at least:
- obtain parameter of interest set-up data relating to measurements of at least one set-up substrate on which a parameter of interest has various first induced set values;
- obtaining etch induced parameter set-up data relating to measurements of at least one set-up substrate on which an etch induced parameter has various second induced set values associated with different etching conditions applied to the at least one set-up substrate, the etch induced parameter affecting measurement of the parameter of interest in a measurement recipe dependent manner;
- determine, based on the parameter of interest set-up data and etch induced parameter set-up data, a measurement recipe describing one or more measurement settings for measuring the parameter of interest from a substrate subject to the etch induced parameter to minimize or reduce an effect of the etch induced parameter on measurement of the parameter of interest; and
- use the measurement recipe to measure a parameter of interest on a product substrate.

\* \* \* \* \*